United States Patent
Rothe et al.

(10) Patent No.: US 11,888,451 B2
(45) Date of Patent: Jan. 30, 2024

(54) AMPLIFIER WITH SAMPLE AND AVERAGE COMMON MODE FEEDBACK RESISTOR

(71) Applicant: THE REGENTS OF THE UNIVERSITY OF MICHIGAN, Ann Arbor, MI (US)

(72) Inventors: Rohit Rothe, Ann Arbor, MI (US); Sechang Oh, Ann Arbor, MI (US); Kyojin Choo, Ann Arbor, MI (US); Seok Hyeon Jeong, Ann Arbor, MI (US); Dennis Sylvester, Ann Arbor, MI (US); David T. Blaauw, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 328 days.

(21) Appl. No.: 17/243,721

(22) Filed: Apr. 29, 2021

(65) Prior Publication Data

US 2021/0344306 A1 Nov. 4, 2021

Related U.S. Application Data

(60) Provisional application No. 63/017,911, filed on Apr. 30, 2020.

(51) Int. Cl.
*H03F 1/02* (2006.01)
*H03F 1/34* (2006.01)
*H03F 3/45* (2006.01)

(52) U.S. Cl.
CPC .......... *H03F 1/34* (2013.01); *H03F 3/45475* (2013.01); *H03F 2200/171* (2013.01); *H03F 2200/331* (2013.01)

(58) Field of Classification Search
CPC .. H03F 1/34; H03F 3/45475; H03F 2200/171; H03F 2200/331; H03F 2203/45526; H03F 1/02; H03F 1/303; H03F 3/005; H03F 1/36; H03F 1/08;
(Continued)

(56) References Cited

U.S. PATENT DOCUMENTS 4,387,345 A * 6/1983 Kelley ................... H03F 1/083
330/108
6,133,784 A 10/2000 Gregoire
(Continued)

*Primary Examiner* — Khanh V Nguyen
(74) *Attorney, Agent, or Firm* — Harness, Dickey & Pierce, P.L.C.

(57) ABSTRACT

An amplifier is presented with a sample and average common mode feedback resistor. The amplifier circuit includes a feedback capacitor and a feedback resistor in parallel with the feedback capacitor, where the feedback capacitor and the feedback resistor form part of the negative feedback path for the amplifier. Of note, the feedback resistor is comprised of a low pass filter in series with a switched capacitor resistor, such that the low pass filter is electrically coupled to the output of the amplifier circuit and the switched capacitor resistor is electrically coupled to the inverting input of the amplifier circuit. The amplifier circuit further includes a control circuit interfaced with switches of the switched capacitor resistor. The high pass corner of the switched capacitor resistor is preferably lower than corner of the low pass filter.

17 Claims, 10 Drawing Sheets

(58) Field of Classification Search
CPC ......... H03F 1/083; H03F 3/19; H03G 1/0088; H03G 1/007; H03H 11/1217; H03H 11/126

See application file for complete search history.

(56) References Cited

U.S. PATENT DOCUMENTS

| | | | |
|---|---|---|---|
| 8,638,165 B2* | 1/2014 | Shah | H03F 3/45475 |
| | | | 330/69 |
| 9,391,569 B2* | 7/2016 | Azin | H03H 19/004 |
| 9,966,915 B2* | 5/2018 | Ahmed | H03G 5/28 |
| 10,505,509 B2 | 12/2019 | Lakshmikumar et al. | |
| 11,025,204 B2* | 6/2021 | Chou | H03F 3/187 |

* cited by examiner

AMPLIFIER WITH SAMPLE AND AVERAGE COMMON MODE FEEDBACK RESISTOR

CROSS-REFERENCE TO RELATED APPLICATIONS

This application claims the benefit of U.S. Provisional Application No. 63/017,911, filed on Apr. 30, 2020. The entire disclosure of this application is incorporated herein by reference.

GOVERNMENT CLAUSE

This invention was made with government support under FA8750-18-C-0134 awarded by the U.S. Department of Defense, Defense Advanced Research Projects Agency. The government has certain rights in the invention.

FIELD

The present disclosure relates to an amplifier with sample and average common mode feedback resistor.

BACKGROUND

Sensors play an integral role in numerous domains, from medical applications to acoustic sensing. Many of these applications have small bandwidths, with frequencies as low as 100 s of mHz. FIG. 1 depicts an example of a continuous-time feedback amplifier. A capacitively coupled amplifier is a common choice in these cases due to its low-power consumption. To establish an input common-mode voltage, the output is typically fed back using a resistor, thereby also aiding input offset cancellation. This presents the key challenge of maintaining a sufficiently low high-pass corner, which is further exacerbated by a small feedback capacitor for high input impedance requirements in low power applications, resulting in the need for tens of teraohms of feedback resistance.

There is a need of a feedback resistor for amplifiers that effectively controls the high-pass corner across temperature with the added benefit of corner frequency programmability.

This section provides background information related to the present disclosure which is not necessarily prior art.

SUMMARY

This section provides a general summary of the disclosure, and is not a comprehensive disclosure of its full scope or all of its features.

An amplifier is presented with a sample and average common mode feedback resistor. In one example, the amplifier circuit includes a feedback capacitor and a feedback resistor in parallel with the feedback capacitor. The feedback capacitor and the feedback resistor form part of the negative feedback path for the amplifier. More specifically, the feedback resistor is comprised of a low pass filter in series with a switched capacitor resistor, such that the low pass filter is electrically coupled to the output of the amplifier circuit and the switched capacitor resistor is electrically coupled to the inverting input of the amplifier circuit. The amplifier circuit further includes a control circuit interfaced with switches of the switched capacitor resistor. The control circuit is configured to supply a drive signal for the switches of the switched capacitor resistor, where switching frequency of the drive signal is less than lower bound of bandwidth of an input signal to the amplifier circuit. The high pass corner of the switched capacitor resistor is preferably lower than corner of the low pass filter.

In some embodiments, the drive signal for the switches of the switched capacitor resistor is a pulsed signal, where duration of pulses is less than a period corresponding to an upper bound of bandwidth of an input signal to the amplifier circuit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
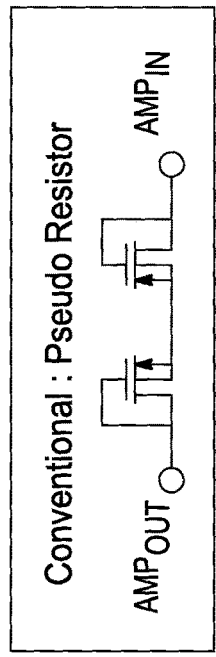
FIG. 1 is a schematic for a conventional amplifier.
Figure 1:
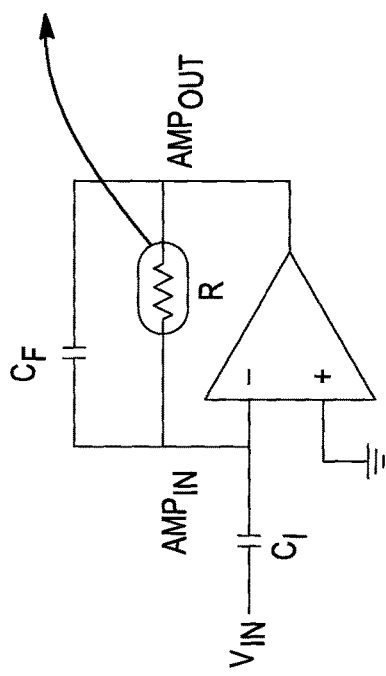
Figure 2:
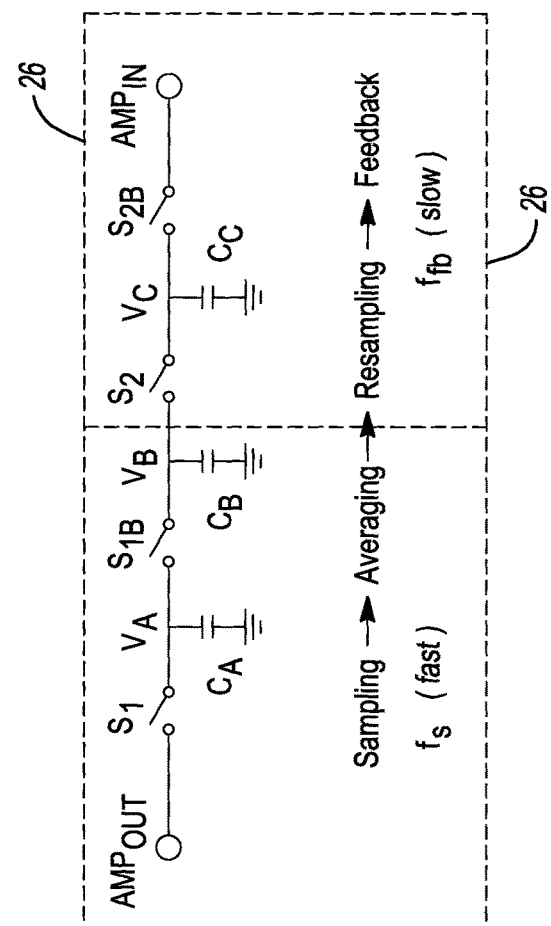
FIG. 2 is a schematic for an amplifier with a sample and average feedback resistor.
Figure 2:
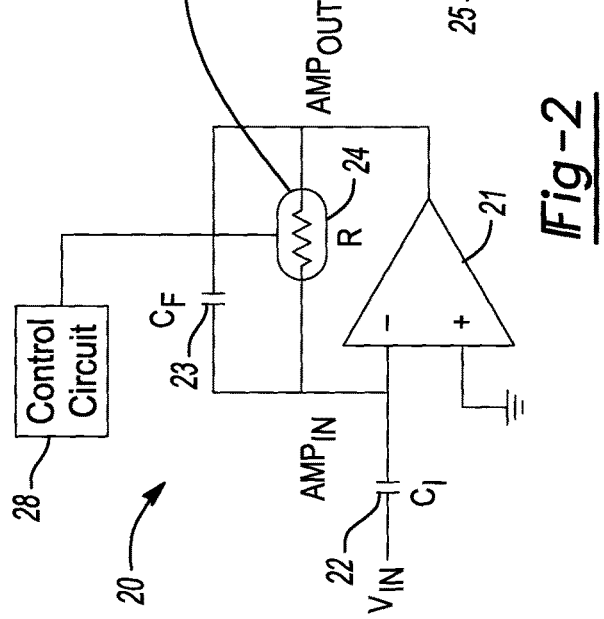

FIG. 2 depicts an example embodiment of an amplifier 20 with a sample and average feedback resistor (SAFR). The amplifier 20 is comprised generally of an amplifier circuit 21 with a negative feedback path. The amplifier circuit 21 has an inverting input, a non-inverting input, and an output. The negative feedback path is formed between the output of the amplifier circuit and the inverting input of the amplifier circuit. The amplifier 20 may also include an input capacitor 22 configured to receive an input signal and electrically coupled to an inverting input of the amplifier circuit 21. While the amplifier circuit is shown in a single ended configuration, it is readily understood that other configurations for the amplifier circuit, such as differential, also fall within the scope if this disclosure.

The negative feedback path is formed by a feedback capacitor 23 in parallel with a sample and average feedback resistor 24. More specifically, the feedback resistor 24 is comprised of a low pass filter 25 in series with a switched capacitor resistor 26, such that the low pass filter is electrically coupled to the output of the amplifier circuit and the switched capacitor resistor is electrically coupled to the inverting input of the amplifier circuit. The feedback resistor 24 effectively controls the HP corner across temperature and corners with the added benefit of corner frequency programmability as will explained below. In an example embodiment, the feedback resistor 24 achieves a resistance of 100 TΩ in a 180 nm CMOS implementation. By using only switches, clocks, and capacitors, and by ensuring the approach is insensitive to pulse width, variation across process and temperature is reduced by 226× compared to a traditional pseudo-resistor implementation.

More specifically, the low pass filter 25 is comprised of first capacitor $C_A$, a first switch $S_1$, a second capacitor $C_B$ and a second switch $S_{1B}$. The first capacitor $C_A$ is electrically coupled between the negative feedback path and ground. The first switch $S_1$ is disposed along the negative feedback path and interconnected between the output of the amplifier circuit and the first capacitor. The second capacitor $C_B$ is electrically coupled between the negative feedback path and ground. The second switch $S_{1B}$ is disposed along the negative feedback path and interconnected between the first capacitor $C_A$ and the second capacitor $C_B$. A control circuit 28 is interfaced with the low pass filter 25 and configured to supply drive signals to the first switch and the second switch.

Figure 3:
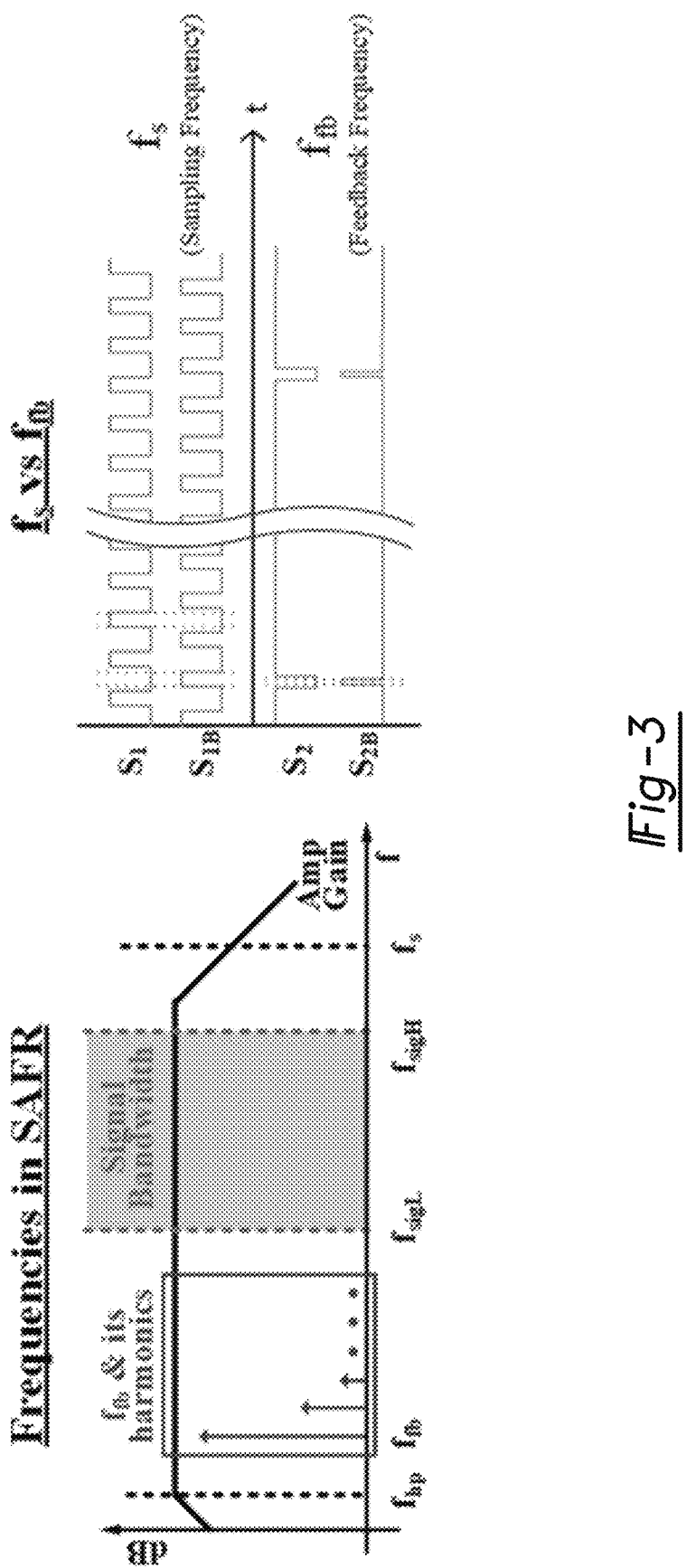
FIG. 3 is diagram illustrating drive signals for the feedback resistor.

During operation, the first switch $S_1$ samples the output on first capacitor $C_A$ in phase $S_1$. This voltage is then accumulated onto capacitor $C_B$ in phase SIB. With reference to FIG. 3, clock phases of the drive signals are non-overlapping (i.e., substantially out of phase) with approximately 50% duty cycle and frequency $f_s$ is set several times higher than the signal bandwidth allowing any injected tones to be filtered out. The first stage stores a low pass filtered version of the required input common mode voltage on second capacitor $C_B$. The low pass corner of the first stage can be tuned with $f_s$ and is set to 1.7 Hz in this example embodiment ($C_B$=9.8 pF).

The second stage is a switched capacitor resistor 26 that passes the common mode voltage from $C_B$ to the amplifier input, thereby establishing the required input common mode. The corner frequency is determined by the switched capacitor resistance ($R=1/f_{fb}C_C$). The switch between capacitor $C_C$ and the amplifier input is closed briefly (~100 ns) so as to not disturb the amplifier and this duration (i.e., duty cycle) does not need to be accurately controlled. The key to obtaining a very low HP corner is to use a very low feedback frequency $f_{fb}$ along with a very small capacitance $C_C$ (6.2 fF in this embodiment). For example, the switching frequency for the drive signals for the switches of the switched capacitor resistor is in the range of 1 Hertz to 1000 Hertz. In the example embodiment, the amplifier uses $f_{fb}$=1.33 Hz and $C_C$=6.2 fF, yielding a resistance of ~100 TΩ. The value of the HP corner can be derived to the first order as $f_{hp}=f_{fb}C_C/2\pi C_F$ and depends only on frequency and capacitance. Since capacitance ratio is relatively process and temperature invariant and frequency can be typically obtained from accurate sources already in the system (e.g., the ADC clock of the system), the corner is tightly controlled. Furthermore, the corner frequency can be easily and quickly programmed by changing $f_{fb}$. For instance, the amplifier can start up quickly using a higher value of $f_{fb}$ (fast settling mode), after which $f_{fb}$ shifts to a lower, final value.

In one example, the feedback switches are implemented as transmission gates. Compared to a pseudo-resistor based servo loop, the added low pass filter in the feedback path results in a second-order transfer function from input to output. For high $f_{fb}$, the system will show second order characteristics such as peaking at the HP corner. However, if $f_{fb}$ is sufficiently low to approximate the system as a first-order system, it closely mimics the pseudo-resistor transfer characteristics. SAFR trades off power consumption due to the clock generation (62 nW in this embodiment) to achieve much better control than pseudo-resistor solutions. However, clock generation can be amortized over multiple feedback loops lowering its per-amplifier overhead.

Figure 4A:
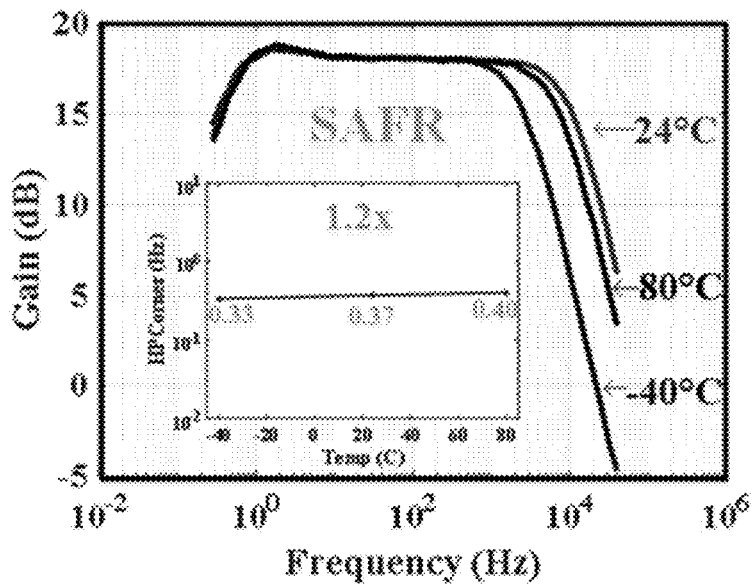
FIGS. 4A and 4B are graphs showing the temperature stability of the sample and average feedback resistor and a conventional pseudo resistor, respectively.
Figure 4B:
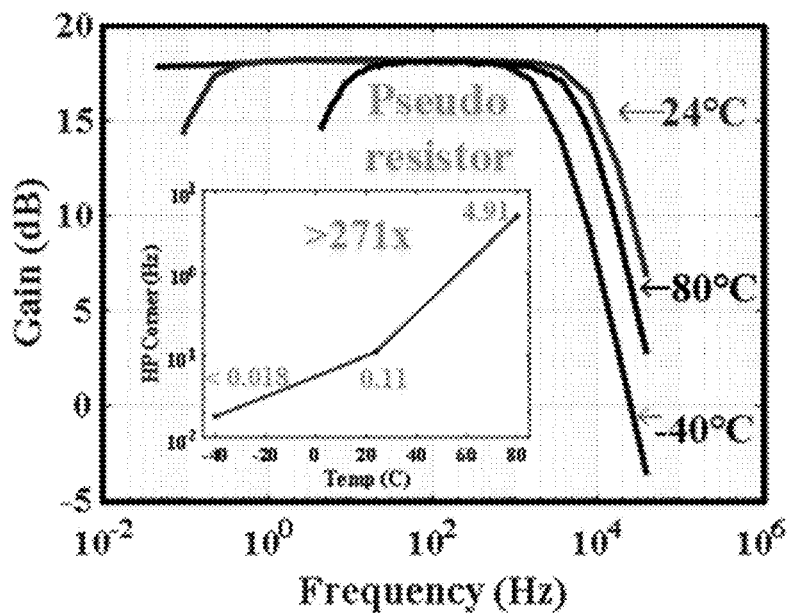
Figure 5:
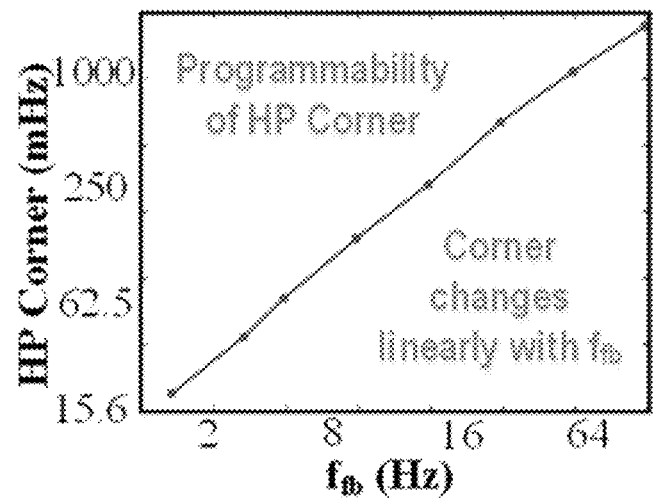
FIG. 5 is a graph showing the programmability of HP corner.
Figure 6:
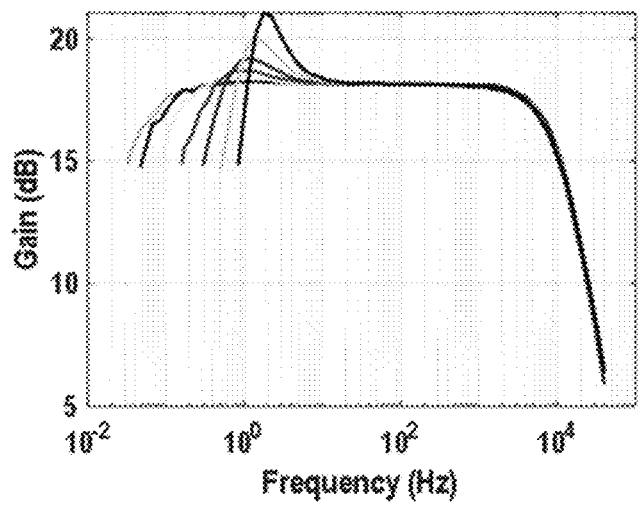
FIG. 6 is a graph showing the transfer curves with changing HP corner.

FIGS. 4A and 4B show the measured LNA transfer curves across −40 to 80° C. for both SAFR and a pseudo-resistor implementation, respectively, with matching HP corners. SAFR shows total 1.2× variation across temperature as compared to 271× for the pseudo-resistor. FIG. 5 depicts the programmability of the corner from 50 mHz-4 Hz by changing $f_{fb}$. FIG. 6 shows the transfer curves with changing HP corner.

Figure 7:
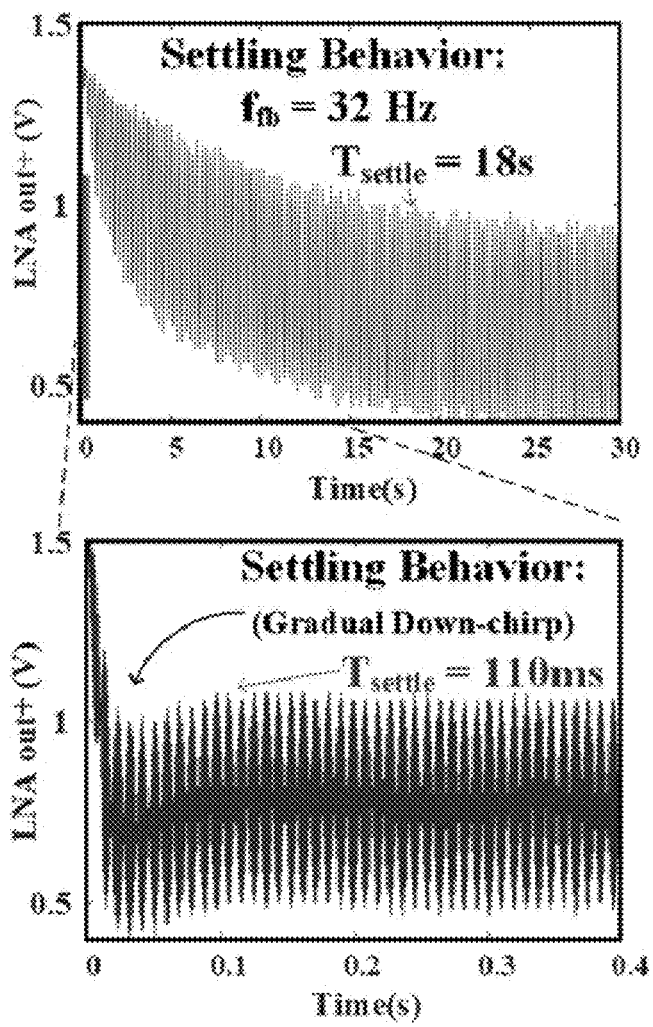
FIG. 7 are graphs showing the settling time a sample and average feedback resistor.
Figure 8:
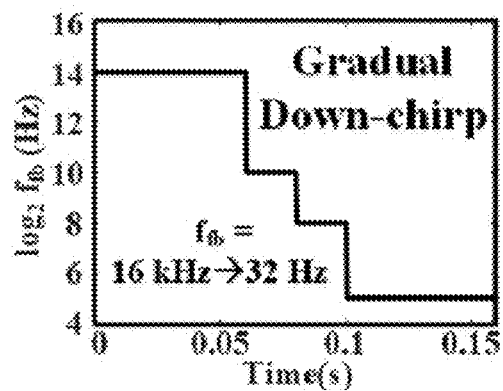
FIG. 8 is a graph showing the gradual down-chirp for a sample average feedback resistor.

FIG. 7 demonstrate the fast settling of a low noise amplifier, reducing it from ~18 s to 110 ms at the initial system startup. The amplifier core power is 70 nW and clock generation power is 62 nW shared over two amplifiers. The measured transfer characteristics for a chain of amplifier (e.g., LNA+PGA) are also shown in FIG. 8 for different gain configurations. Overall, SAFR maintains similar amplifier specifications for noise, harmonic distortion, and performance as compared to its pseudo-resistor version. Accurate control of the high pass corner permits the use of the amplifier in many biomedical applications and guarantees reliable performance across a wide range of temperatures and process variation.

Figure 9:
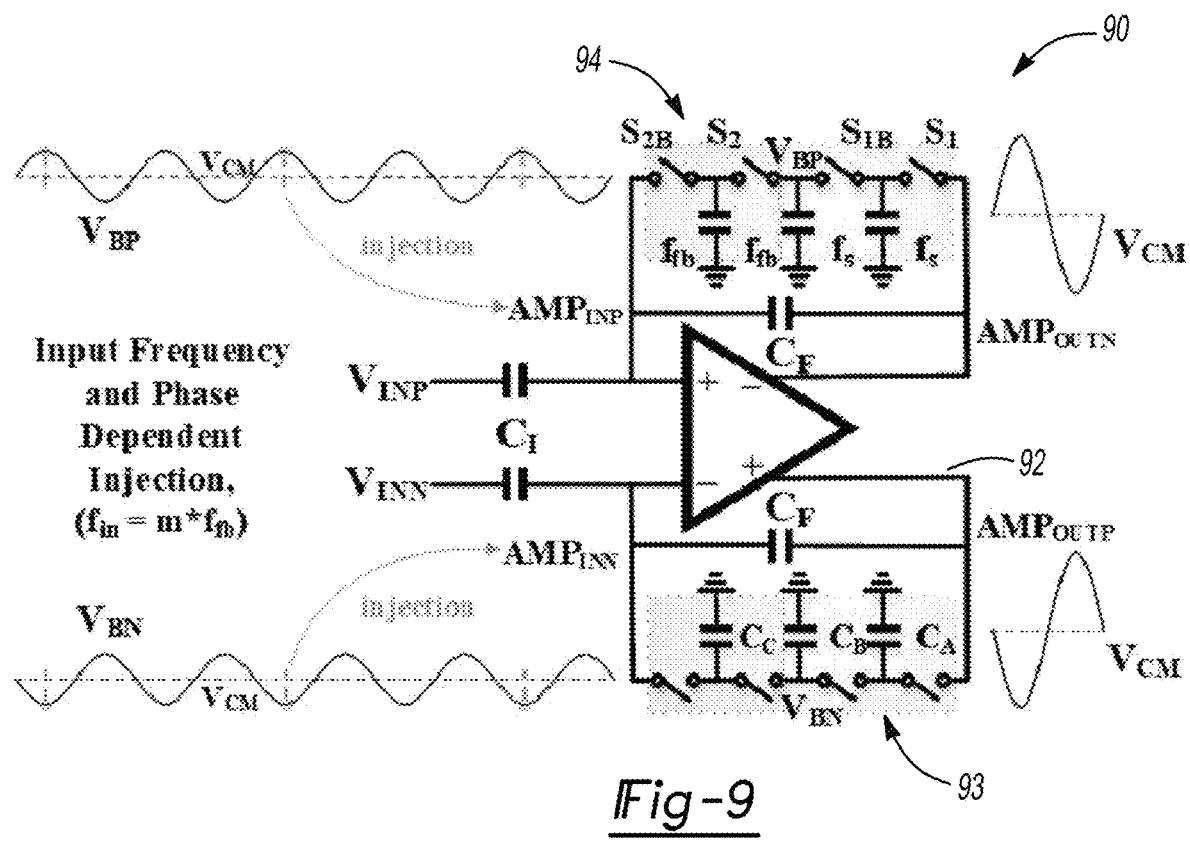
FIG. 9 is a schematic for an amplifier with a sample and average feedback resistor.

FIG. 9 is a schematic for a differential amplifier circuit 90 which uses a sample and average feedback resistor in both feedback paths. The differential amplifier 92 has an inverting input, a non-inverting input, a first output, and a second output. A first feedback path 93 is formed between the first output of the amplifier circuit and the inverting input of the amplifier circuit; whereas, a second feedback path 94 is formed between the second output of the amplifier circuit and the non-inverting input of the amplifier circuit.

Each feedback path makes use of the sample and average feedback resistor described above. That is, the first feedback resistor in the first feedback path is comprised of a low pass filter in series with a switched capacitor resistor, such that the low pass filter is electrically coupled to the first output of the amplifier circuit and the switched capacitor resistor is electrically coupled to the inverting input of the amplifier circuit. The first feedback path also include a first feedback capacitor coupled in parallel with the first feedback capacitor.

Likewise, the second feedback resistor in the second feedback path is comprised of a low pass filter in series with a switched capacitor resistor, such that the low pass filter is electrically coupled to the second output of the amplifier circuit and the switched capacitor resistor is electrically coupled to the non-inverting input of the amplifier circuit. The second feedback path also includes a second feedback capacitor in parallel with the second feedback resistor.

During operation, the differential amplifier circuit 90 leverages the sample and average feedback resistor to achieve TΩ resistance in a PT robust manner. As described above, the sample and average resistor generates an averaged output voltage $V_B$ using a sampling clock $f_s$, higher than the signal bandwidth, and then injects this voltage at the amplifier input using a small capacitor $C_C$ with feedback frequency $f_{fb}$ that is below the signal bandwidth. It was observed, however, that if the input frequency $f_{in}$ is an integer multiple of $f_{fb}$, the two voltages sampled on $C_C$ will be 180° out of phase, leading to a consistent, phase-dependent output offset.

Figure 10:
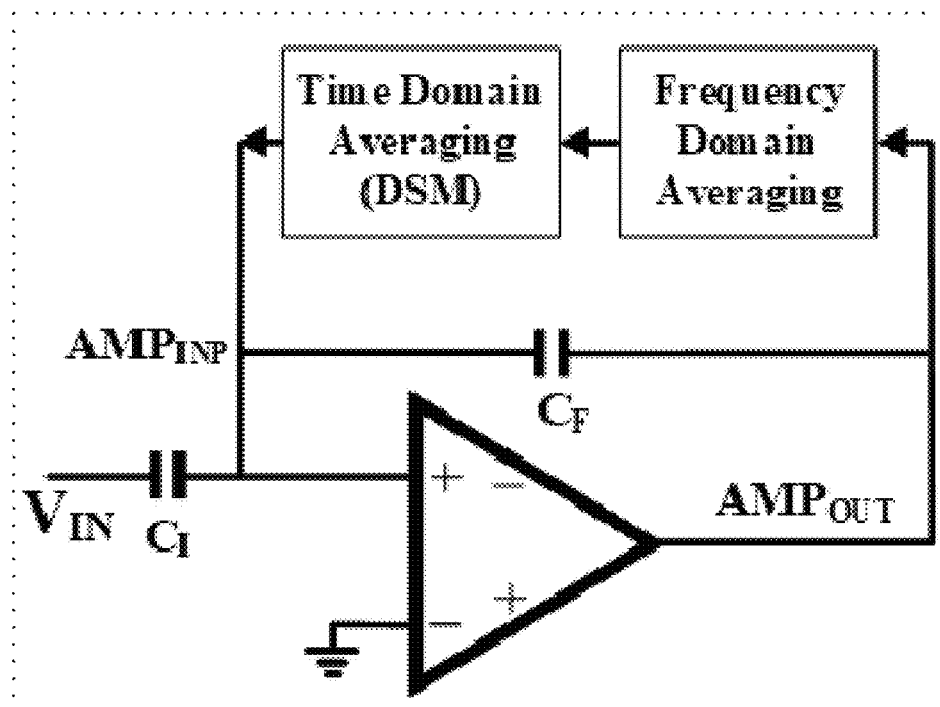
FIG. 10 is a diagram showing the proposed sample and average feedback resistor with time domain averaging in the 2nd stage.
Figure 11A:
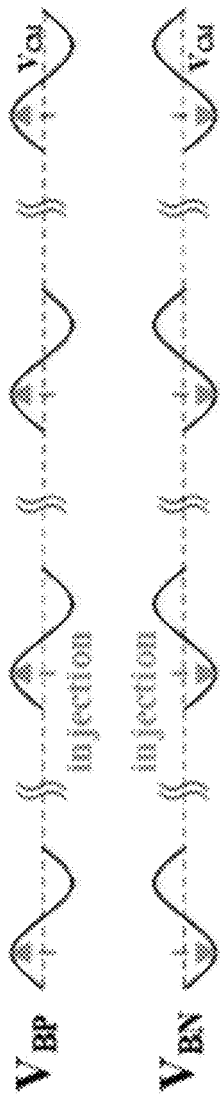
FIGS. 11A and 11B are diagrams showing constant phase sampling injections of the switching frequency which leads to offset and variance of the switching frequency which substantially eliminates the offset, respectively.
Figure 11B:
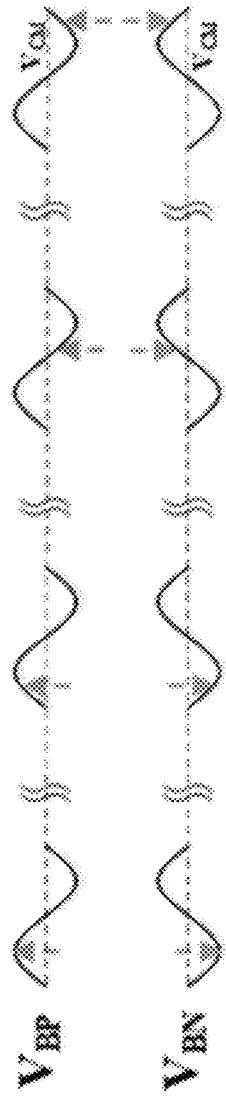

To address this issue, the frequency domain averaging of the 1st stage of the feedback structure is augmented with time domain averaging in the 2nd stage as shown in FIG. 10. With reference to FIG. 11A, constant phase sampling injections of $f_{fb}$ lead to offset at the amplifier input. Conversely, when the switching frequency $f_{fb}$ was varied as shown in FIG. 11B while maintaining the switching frequency constant over a long time period, the offset was effectively eliminated.

Figure 12:
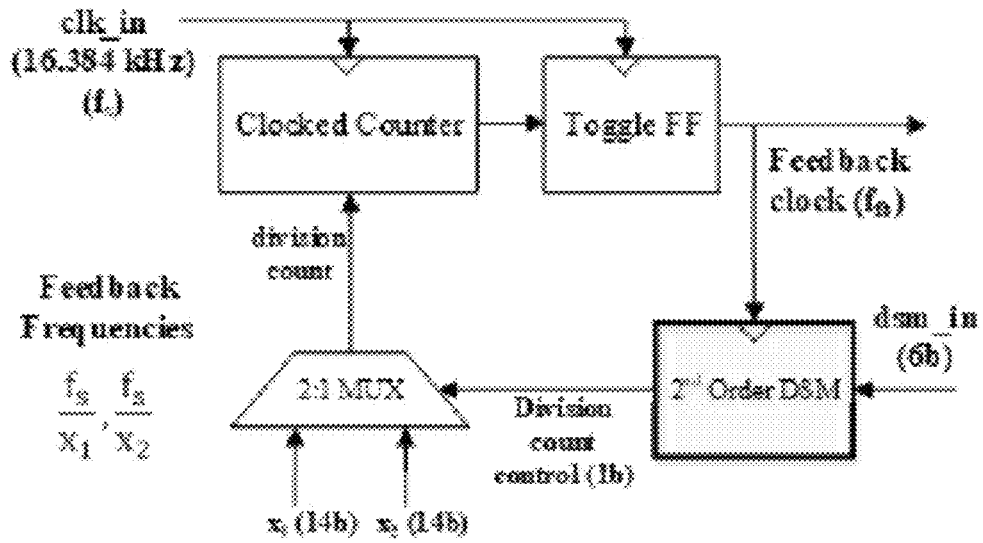
FIG. 12 is a schematic of an example circuit which can be used to vary the switching frequency using a delta sigma modulator.

In an example embodiment, the switching frequency can be varied using a delta sigma modulator as seen in FIG. 12. In this example, two feedback frequencies $f_{fb1}$ and $f_{fb2}$ are generated using a counter-based frequency divider, clocked by $f_s$ and with a time-period resolution of $f_s$ (1/16k=62.5 us) by counting to $x_1$ and $x_2$, respectively. Selection between these two frequencies is made using a 1-bit 2nd-order delta sigma modulator (DSM). Hence, the injection frequency jumps between $f_{fb1}$ and $f_{fb2}$ with the DSM ensuring the desired feedback frequency is achieved on average. Since the delta sigma modulator is clocked by $f_{fb}$ (~16 Hz) it is implemented using thick-oxide, HVT devices to reduce its leakage-dominated power (<22 nW, simulated). By selecting $x_1$ and $x_2$ as co-prime, one guarantees that the minimum frequency that exhibits constant phase sampling is $f_s$. This means that multiplicity between $f_{fb}$ and any input signal frequency within the amplifier bandwidth is infeasible ($f_s$>amplifier bandwidth). Hence, the sampled and injected values of $V_{BP}$ and $V_{BN}$ are properly averaged in time over multiple cycles, thereby eliminating the source of the offset.

Figure 13:
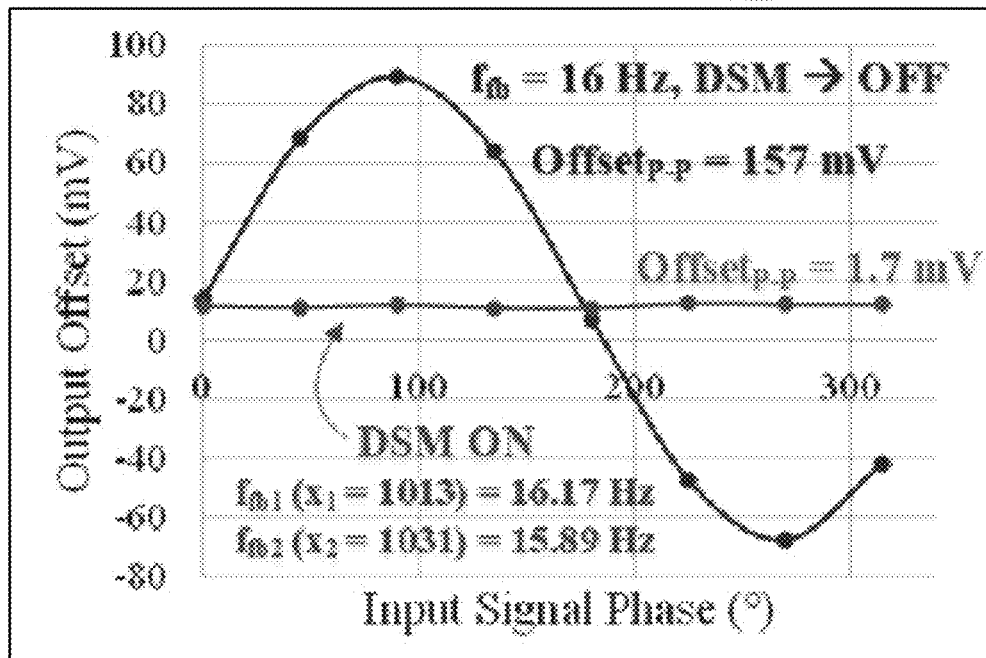
FIG. 13 is a graph comparing the measured amplifier output offset to the input phase.

FIG. 13 shows measured amplifier output offset vs. input phase with and without using delta sigma modulator at 32 Hz $f_{in}$ with a fixed 16 Hz $f_{fb}$. This technique reduces phase dependent offset by ~90× from 157 mV to 1.7 mV and worst-case offset from 89.4 mV to 12.7 mV.

Figure 14A:
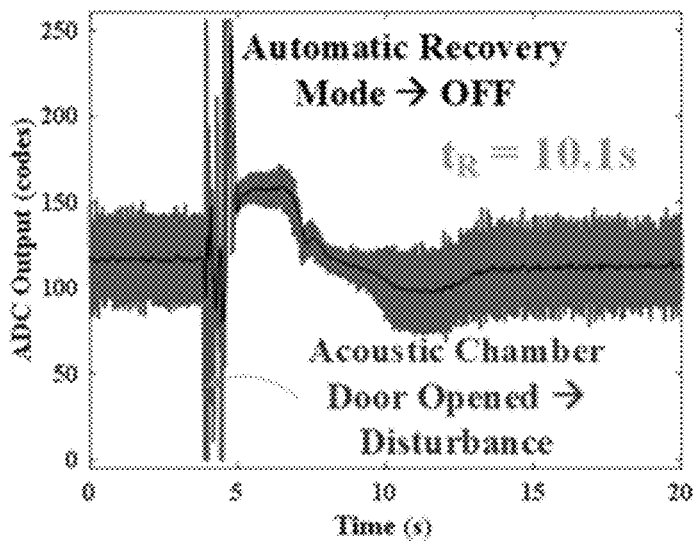
FIGS. 14A and 14B are plots showing amplifier output with and without an automatic recovery mode, respectively.
Figure 14B:
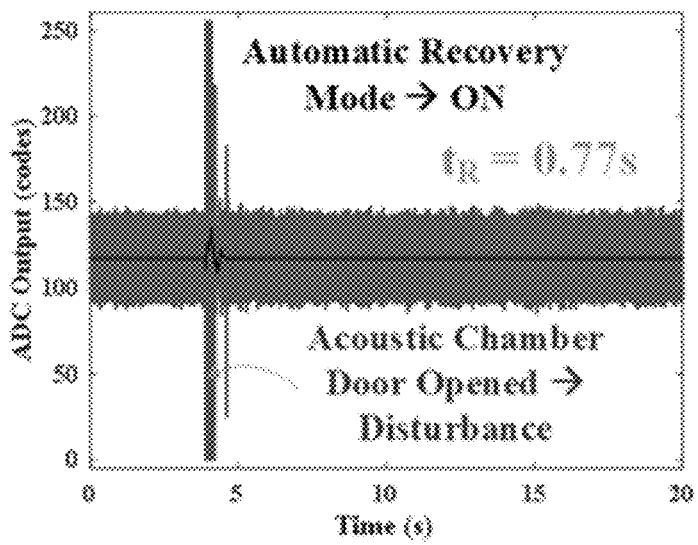
Figure 15:
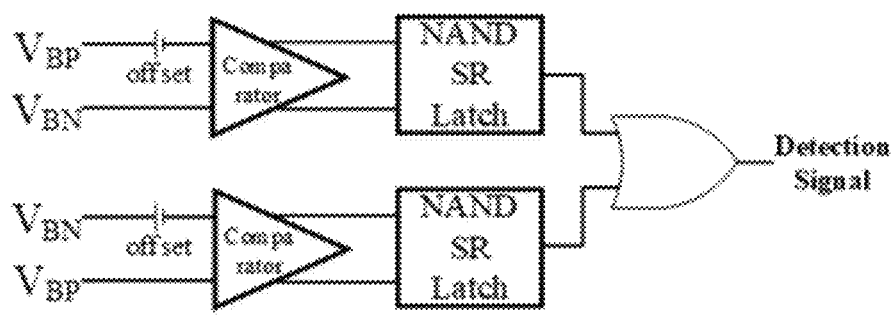
FIG. 15 is a schematic of an example circuit which can be used to detect saturation of an amplifier.
Figure 16:
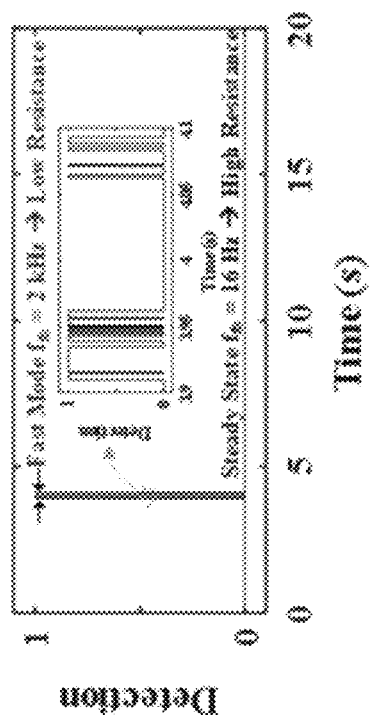
FIG. 16 is a graph showing a technique for rapidly driving the amplifier back to stable operation.

In another aspect, the low high-pass corner results in long amplifier stabilization times (~sec), making it vulnerable to abrupt, in-band pressure changes that saturate operation, e.g., wind or door closures as seen in FIGS. 14A and 14B. To detect amplifier saturation, one can compare $V_{BP}$ and $V_{BN}$, which are low pass versions of the differential output and already available in the sample and average feedback resistor structure—this removes the danger of false triggering when directly observing amplifier outputs. An example circuit which can be used to detect amplifier saturation is shown in FIG. 15. During saturation, these nodes drift from common mode to opposite rails. Since they are low-pass filtered, one can use low bandwidth comparators to reduce power. The comparators have an offset of $V_{th}$ (140 mV in the example design) and check for $V_{BP}$>$V_{BN}$ $V_{th}$ and $V_{BN}$>$V_{BP}$ $V_{th}$. When a comparator triggers, the feedback frequency clock divider switches to a high frequency mode (programmable from 250 Hz-4 kHz here) and rapidly drives the amplifier back to stable operation as soon as the artifact ends. This technique is shown in FIG. 16. The same mechanism enables fast initial startup, greatly reducing amplifier initialization time, important in duty-cycled applications.

Figure 17:
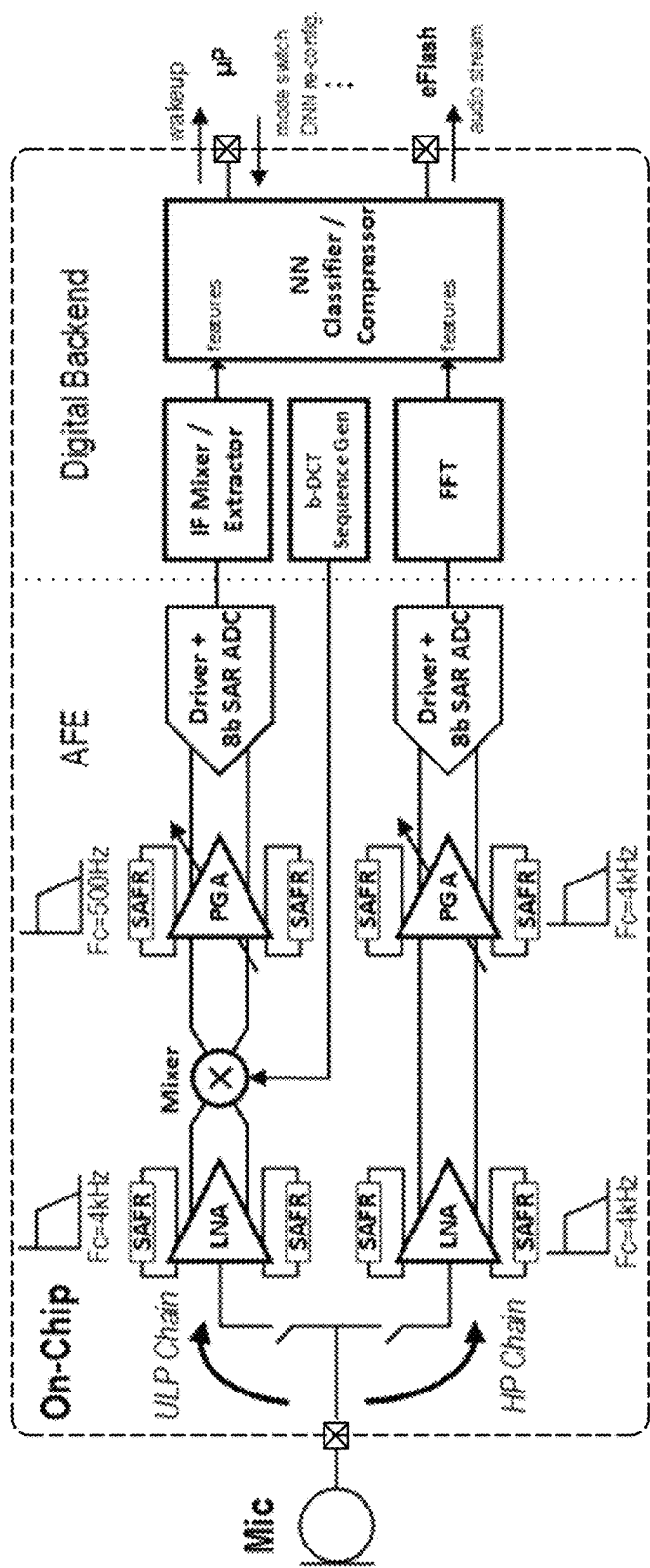
FIG. 17 is a diagram illustrating a speech recognition system with amplifiers having the proposed sample and average feedback resistor.

An amplifier circuit with the proposed sample and average common mode feedback resistor can be used in different applications. In one example, amplifiers with the proposed sample and average feedback resistor can be used in a speech recognition system 160 as seen in FIG. 17. The speech recognition system 160 is comprised generally of a microphone 162, an analog front end circuit 163 and a digital processor 164. The analog front end circuit 163 may include a upper (low power) circuit path and a lower (high performance) circuit path. Each circuit path includes a low noise amplifier 165 and a programmable-gain amplifier 166. In this example, each amplifier is a differential amplifier configured with a proposed sample and average feedback resistor 167 in both feedback paths. This is merely one suitable use for the proposed sample and average feedback resistor described herein. As is readily understood by skilled artisans, the proposed sample and average feedback resistor is suitable for other applications as well.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An amplifier comprising:
   an amplifier circuit having an inverting input, a non-inverting input, and a negative feedback path between an output of the amplifier circuit and the inverting input of the amplifier circuit;
   a feedback capacitor forms part of the negative feedback path;
   a feedback resistor in parallel with the feedback capacitor forms part of the negative feedback path, wherein the feedback resistor is comprised of a low pass filter in series with a switched capacitor resistor, such that the low pass filter is electrically coupled to the output of the amplifier circuit and the switched capacitor resistor is electrically coupled to the inverting input of the amplifier circuit, wherein high pass corner of the switched capacitor resistor is lower than corner of the low pass filter; and
   a control circuit configured to supply a drive signal for controlling the switched capacitor resistor, where switching frequency of the drive signal is less than lower bound of bandwidth of an input signal to the amplifier circuit.

2. The amplifier of claim 1 wherein the drive signal for the switches of the switched capacitor resistor is a pulsed signal, where duration of pulses is less than a period corresponding to an upper bound of bandwidth of an input signal to the amplifier circuit.

3. The amplifier of claim 1 wherein the low pass filter further comprises
- a first capacitor electrically coupled between the negative feedback path and ground;
- a first switch disposed along the negative feedback path and interconnected between the output of the amplifier circuit and the first capacitor;
- a second capacitor electrically coupled between the negative feedback path and ground; and
- a second switch disposed along the negative feedback path and interconnected between the first capacitor and the second capacitor.

4. The amplifier of claim 3 wherein control circuit is interfaced with the low pass filter and configured to supply drive signals to the first switch and the second switch, such that the drive signals have fifty percent duty cycle substantially out of phase with each other.

5. The amplifier of claim 4 wherein the drive signals to the first switch and the second switch have a frequency higher than bandwidth of an input signal to the amplifier circuit.

6. The amplifier of claim 1 wherein the control circuit varies switching frequency of the drive signal from period to period of the drive signal while maintaining the switching frequency constant over a time period, where the time period is larger than two or more period of the drive signal.

7. The amplifier of claim 6 wherein the control circuit varies the switching frequency using a delta sigma modulator.

8. The amplifier of claim 1 wherein the control circuit is configured to detect saturation of the amplifier and, in response to detecting saturation of the amplifier, substantially increases the switching frequency of the drive signal.

9. An amplifier comprising:
- an amplifier circuit having an inverting input, a non-inverting input, and a first feedback path between an output of the amplifier circuit and one of the inverting input or the non-inverting input of the amplifier circuit;
- a feedback capacitor forms part of the first feedback path;
- a feedback resistor in parallel with the feedback capacitor forms part of the first feedback path, wherein the feedback resistor is comprised of a low pass filter in series with a switched capacitor resistor, such that the low pass filter is electrically coupled to the output of the amplifier circuit and the switched capacitor resistor is electrically coupled to the inverting input of the amplifier circuit; and
- a control circuit configured to supply a drive signal for controlling the switched capacitor resistor, where switching frequency of the drive signal is less than lower bound of bandwidth of an input signal to the amplifier circuit.

10. The amplifier of claim 9 further comprises
- a second feedback path between a second output of the amplifier circuit and the other the inverting input or the non-inverting input of the amplifier circuit;
- a feedback capacitor forms part of the second feedback path;
- a feedback resistor in parallel with the feedback capacitor forms part of the second feedback path, wherein the feedback resistor is comprised of a low pass filter in series with a switched capacitor resistor, such that the low pass filter is electrically coupled to the output of the amplifier circuit and the switched capacitor resistor is electrically coupled to the inverting input of the amplifier circuit.

11. The amplifier of claim 9 wherein the drive signal for the switches of the switched capacitor resistor is a pulsed signal, where duration of pulses is less than a period corresponding to an upper bound of bandwidth of an input signal to the amplifier circuit.

12. The amplifier of claim 9 wherein high pass corner of the switched capacitor resistor is lower than corner of the low pass filter.

13. The amplifier of claim 9 wherein the control circuit varies switching frequency of the drive signal from period to period of the drive signal while maintaining the switching frequency constant over a time period, where the time period is larger than two or more period of the drive signal.

14. The amplifier of claim 9 wherein the control circuit is configured to detect saturation of the amplifier and, in response to detecting saturation of the amplifier, substantially increases the switching frequency of the drive signal.

15. An amplifier circuit comprising:
- a differential amplifier circuit having an inverting input, a non-inverting input, a first output with a first feedback path between the first output of the amplifier circuit and the inverting input of the amplifier circuit, and a second output with a second feedback path between the second output of the amplifier circuit and the non-inverting input of the amplifier circuit;
- a first feedback capacitor forms part of the first feedback path;
- a first feedback resistor in parallel with the first feedback capacitor forms part of the first feedback path, wherein the first feedback resistor is comprised of a low pass filter in series with a switched capacitor resistor, such that the low pass filter is electrically coupled to the first output of the amplifier circuit and the switched capacitor resistor is electrically coupled to the inverting input of the amplifier circuit;
- a second feedback capacitor forms part of the second feedback path;
- a second feedback resistor in parallel with the second feedback capacitor forms part of the second feedback path, wherein the second feedback resistor is comprised of a low pass filter in series with a switched capacitor resistor, such that the low pass filter is electrically coupled to the second output of the amplifier circuit and the switched capacitor resistor is electrically coupled to the non-inverting input of the amplifier circuit; and
- a control circuit configured to supply a drive signal for controlling the switched capacitor resistors, where switching frequency of the drive signal is less than lower bound of bandwidth of an input signal to the amplifier circuit.

16. The amplifier of claim 15 wherein the drive signal for the switches of the switched capacitor resistors is a pulsed signal, where duration of pulses is less than a period corresponding to an upper bound of bandwidth of an input signal to the amplifier circuit.

17. The amplifier of claim 15 wherein high pass corner of the switched capacitor resistors is lower than corner of the low pass filter.

* * * * *